(12) United States Patent
Jeong et al.

(10) Patent No.: US 8,502,753 B2
(45) Date of Patent: Aug. 6, 2013

(54) ORGANIC LIGHT EMITTING DIODE DISPLAY

(75) Inventors: Hee-Seong Jeong, Yongin (KR);
Sung-Soo Koh, Yongin (KR);
Soon-Ryong Park, Yongin (KR);
Woo-Suk Jung, Yongin (KR);
Chul-Woo Jeong, Yongin (KR);
Il-Ryong Cho, Yongin (KR); Tae-Kyu Kim, Yongin (KR); Jae-Yong Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 384 days.

(21) Appl. No.: 12/904,067

(22) Filed: Oct. 13, 2010

(65) Prior Publication Data
US 2011/0134020 A1    Jun. 9, 2011

(30) Foreign Application Priority Data
Dec. 7, 2009    (KR) .................. 10-2009-0120725

(51) Int. Cl.
*G09G 3/30* (2006.01)

(52) U.S. Cl.
USPC ........................................................... 345/76

(58) Field of Classification Search
USPC ................. 345/76, 77, 82, 83, 92; 315/169.1
See application file for complete search history.

(56) References Cited

U.S. PATENT DOCUMENTS

| 2005/0179371 A1* | 8/2005 | Broer et al. ................... 313/506 |
| 2006/0255706 A1* | 11/2006 | Mitsui et al. .................. 313/112 |

FOREIGN PATENT DOCUMENTS

| JP | 2001-244080 | 9/2001 |
| JP | 2003-186413 | 7/2003 |
| JP | 2004-030955 | 1/2004 |
| KR | 1020040088537 | 10/2004 |
| KR | 1020040097373 | 11/2004 |
| KR | 10-2008-0040511 A | 5/2008 |
| KR | 10-2009-0099248 | 9/2009 |

* cited by examiner

*Primary Examiner* — Kevin M Nguyen
(74) *Attorney, Agent, or Firm* — Knobbe Martens Olson & Bear LLP

(57) ABSTRACT

An organic light emitting diode display is disclosed. The display includes a first semitransparent electrode, an organic emissive layer placed on the first semitransparent electrode, a second semitransparent electrode placed on the organic emissive layer, and a first selective reflection layer placed on the second semitransparent electrode.

14 Claims, 14 Drawing Sheets

| RED | MgAg(Å) | Front side | | | Rear side | | | Rear+Front |
|---|---|---|---|---|---|---|---|---|
| | | Rx | Ry | Re (cd/A) | Rx | Ry | Re (cd/A) | Re (cd/A) |
| | 200 | 0.676 | 0.323 | 9.68 | 0.681 | 0.318 | 17.86 | 27.54 |

| GREEN | MgAg(Å) | Front side | | | Rear side | | | Rear+Front |
|---|---|---|---|---|---|---|---|---|
| | | Gx | Gy | Ge (cd/A) | Gx | Gy | Ge (cd/A) | Ge (cd/A) |
| | 200 | 0.216 | 0.728 | 6.67 | 0.269 | 0.692 | 21.15 | 27.82 |

| BLUE | MgAg(Å) | Front side | | | Rear side | | | Rear+Front |
|---|---|---|---|---|---|---|---|---|
| | | Bx | By | Be (cd/A) | Bx | By | Be (cd/A) | Be (cd/A) |
| | 200 | 0.139 | 0.054 | 0.75 | 0.134 | 0.098 | 3.01 | 3.76 |

(b)

| RED | MgAg(Å) | Front side | | | Rear side | | | Rear+Front |
|---|---|---|---|---|---|---|---|---|
| | | Rx | Ry | Re (cd/A) | Rx | Ry | Re (cd/A) | Re (cd/A) |
| | 200 | 0.669 | 0.33 | 5.32 | 0.678 | 0.321 | 25.33 | 30.64 |

| GREEN | MgAg(Å) | Front side | | | Rear side | | | Rear+Front |
|---|---|---|---|---|---|---|---|---|
| | | Gx | Gy | Ge (cd/A) | Gx | Gy | Ge (cd/A) | Ge (cd/A) |
| | 200 | 0.204 | 0.725 | 4.19 | 0.255 | 0.698 | 23.60 | 27.79 |

| BLUE | MgAg(Å) | Front side | | | Rear side | | | Rear+Front |
|---|---|---|---|---|---|---|---|---|
| | | Bx | By | Be (cd/A) | Bx | By | Be (cd/A) | Be (cd/A) |
| | 200 | 0.14 | 0.051 | 0.44 | 0.137 | 0.080 | 3.37 | 3.81 |

| RED | Front side | | | Rear side | | | Rear+Front | After POL-transmitted |
|---|---|---|---|---|---|---|---|---|
| MgAg(Å) | Rx | Ry | Re (cd/A) | Rx | Ry | Re (cd/A) | Re (cd/A) | Re (cd/A) |
| 200 | 0.676 | 0.323 | 9.68 | 0.681 | 0.318 | 17.86 | 27.54 | 13.22 |

| GREEN | Front side | | | Rear side | | | Rear+Front | After POL-transmitted |
|---|---|---|---|---|---|---|---|---|
| MgAg(Å) | Gx | Gy | Ge (cd/A) | Gx | Gy | Ge (cd/A) | Ge (cd/A) | Ge (cd/A) |
| 200 | 0.216 | 0.728 | 6.67 | 0.269 | 0.692 | 21.15 | 27.82 | 13.35 |

| BLUE | Front side | | | Rear side | | | Rear+Front | After POL-transmitted |
|---|---|---|---|---|---|---|---|---|
| MgAg(Å) | Bx | By | Be (cd/A) | Bx | By | Be (cd/A) | Be (cd/A) | Be (cd/A) |
| 200 | 0.139 | 0.054 | 0.75 | 0.134 | 0.098 | 3.01 | 3.76 | 1.80 |

(b)

| RED | Front side | | | Rear side | | | Rear+Front | After POL-transmitted |
|---|---|---|---|---|---|---|---|---|
| MgAg(Å) | Rx | Ry | Re (cd/A) | Rx | Ry | Re (cd/A) | Re (cd/A) | Re (cd/A) |
| 200 | 0.678673 | 0.320327 | 14.53 | 0.674 | 0.326 | 15.14 | 29.66 | 28.48 |

| GREEN | Front side | | | Rear side | | | Rear+Front | After POL-transmitted |
|---|---|---|---|---|---|---|---|---|
| MgAg(Å) | Gx | Gy | Ge (cd/A) | Gx | Gy | Ge (cd/A) | Ge (cd/A) | Ge (cd/A) |
| 200 | 0.250784 | 0.700881 | 13.98 | 0.246 | 0.701 | 13.38 | 27.36 | 26.26 |

| BLUE | Front side | | | Rear side | | | Rear+Front | After POL-transmitted |
|---|---|---|---|---|---|---|---|---|
| MgAg(Å) | Bx | By | Be (cd/A) | Bx | By | Be (cd/A) | Be (cd/A) | Be (cd/A) |
| 200 | 0.136626 | 0.078354 | 1.88 | 0.138 | 0.076 | 1.86 | 3.73 | 3.59 |

ORGANIC LIGHT EMITTING DIODE DISPLAY

CROSS-REFERENCE TO RELATED APPLICATIONS

This application claims priority to and the benefit of Korean Patent Application No. 10-2009-0120725 filed in the Korean Intellectual Property Office on Dec. 7, 2009, the entire content of which is incorporated herein by reference.

BACKGROUND

1. Field

The described technology relates generally to an organic light emitting diode display, and more particularly, to an organic light emitting diode display emitting light in dual-sided directions.

2. Description of the Related Technology

Organic light emitting diode displays have self-emissive characteristics, and differ from liquid crystal displays (LCD) by not requiring a separate light source and being relatively thin and lightweight. Organic light emitting diode displays exhibit high quality characteristics such as low power consumption, high luminance, and short response time.

Organic light emitting diode displays generally include a first substrate with organic light emitting diodes, and a second substrate, facing the first substrate, to protect the organic light emitting diodes of the first substrate.

Conventional organic light emitting diode displays may be classified as one-side emission type displays which allow images to be viewed in one direction, and dual-side emission type displays which allow images to be viewed in two directions.

One-side emission type displays generally include a reflective electrode, a semitransparent electrode, and an organic emissive layer disposed between the reflective electrode and the semitransparent electrode, to emit light. The organic emissive layer emits light in one direction, in the direction of the semitransparent electrode, such that images are viewed on that side.

Dual-side emission type displays generally include two semitransparent electrodes placed facing each other, and an organic emissive layer disposed between the semitransparent electrodes, to emit light. The organic emissive layer emits light in two directions, in the direction of both semitransparent electrodes, such that images are viewed on both sides.

In one-sided emission displays, the light emitted from the organic emissive layer is repeatedly reflected between the reflective electrode and the semitransparent electrode such that there is a considerable micro-cavity effect as well as high light emission efficiency. In dual-sided emission displays, the light emitted from the organic emissive layer is reflected between the semitransparent electrodes less repeatedly than with the one-sided emission displays; the micro-cavity effect is thus reduced, and the light emission efficiency is also reduced.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One aspect is an organic light emitting diode display device including: a first semitransparent electrode; an organic emissive layer placed on the first semitransparent electrode and configured to emit light including a left-circular polarized light beam and a right-circular polarized light beam; a second semitransparent electrode placed on the organic emissive layer; and a first selective reflection layer placed on the second semitransparent electrode.

Another aspect is an organic light emitting diode display device wherein the first selective reflection layer includes a cholesteric liquid crystal.

Another aspect is an organic light emitting diode display device wherein the first selective reflection layer is configured to either transmit the left-circular polarized light beam and reflect the right-circular polarized light beam or transmit the right-circular polarized light beam and reflect the left-circular polarized light beam.

Another aspect is an organic light emitting diode display device wherein the light beam reflected from the first selective reflection layer is configured to be transmitted to the outside of the organic light emitting diode display device by passing through the second semitransparent electrode, the organic emissive layer and the first semitransparent electrode, thereby reinforcing the light emitted from the organic emissive layer, transmitted to the outside after travelling the first semitransparent electrode, and the light emitted from the organic emissive layer, transmitted to the outside after being reflected by the second semitransparent electrode, and then travelling through the first semitransparent electrode.

Another aspect is an organic light emitting diode display device further including a first polarizing plate placed on the first selective reflection layer configured to transmit to the outside of the device the polarized light beam transmitted through the first selective reflection layer, to absorb the light beam of opposite polarization, and to transmit to the first selective reflection layer only external light of the same polarization, wherein the first selective reflection layer transmits the external light of the same polarization, thereby minimizing reflection of external light.

Another aspect is an organic light emitting diode display device wherein one of the first and second semitransparent electrodes functions as an anode, and the other functions as a cathode.

Another aspect is an organic light emitting diode display device further including a second selective reflection layer placed under the first semitransparent electrode, wherein the second selective reflection layer is configured to transmit and reflect the polarized light beams of an opposite polarization than the first selective reflection layer.

Another aspect is an organic light emitting diode display device wherein the second selective reflection layer includes a cholesteric liquid crystal.

Another aspect is an organic light emitting diode display device further including a second polarizing plate placed under the second selective reflection layer configured to transmit the polarized light beam transmitted through the second selective reflection layer.

Another aspect is an organic light emitting diode display device including: a first semitransparent electrode; an organic emissive layer placed over the first semitransparent electrode and configured to emit light including light beams of a first polarization and light beams of a second polarization, wherein the second polarization is an opposite polarization of the first polarization; a second semitransparent electrode placed over the organic emissive layer; a selective reflection layer placed over the second semitransparent electrode and configured to substantially transmit the light beams of the first polarization and to substantially reflect the light beams of the second polarization; a polarizing plate placed over the selective reflection layer and configured to substantially transmit to the outside the light beams of the first polarization transmitted through the selective reflection layer, and further to substantially transmit light beams of the first polarization from the outside of the device.

Another aspect is an organic light emitting diode display device wherein the selective reflection layer is further configured to transmit toward the organic emissive layer the light beams of the first polarization from the outside of the device without substantial reflection of the light beams of the first polarization.

Another aspect is an organic light emitting diode display device wherein the selective reflection layer includes a cholesteric liquid crystal.

Another aspect is an organic light emitting diode display device wherein the selective reflection layer is configured to mostly transmit the light beams of the first polarization and mostly reflect the light beam of the second polarization.

Another aspect is an organic light emitting diode display device wherein the polarizing plate is further configured to absorb light beams of the second polarization from the outside of the device.

Another aspect is an organic light emitting diode display device wherein the selective reflection layer is configured to transmit a right-circular polarized light beam from the organic emissive layer toward the polarizing plate and to reflect a left-circular polarized light beam from the organic emissive layer.

Another aspect is an organic light emitting diode display device further configured to permit a light beam of the second polarization reflected from the selective reflection layer to be transmitted to the outside of the organic light emitting diode display device by passing through the second semitransparent electrode, the organic emissive layer and the first semitransparent electrode.

Another aspect is an organic light emitting diode display device wherein the polarizing plate is further configured to absorb light beams of the second polarization from the outside of the device, thereby minimizing reflection of light beams from the outside in the device.

Another aspect is an organic light emitting diode display device further including: another selective reflection layer placed under the first semitransparent electrode and is configured to substantially transmit the light beams of the second polarization and substantially reflect the light beams of the first polarization; and another polarizing plate placed under the other selective reflection layer and configured to substantially transmit to the outside the light beams of the second polarization transmitted through the other selective reflection layer.

Another aspect is an organic light emitting diode display device further configured to permit a light beam of the second polarization reflected from the selective reflection layer to be transmitted to the outside of the organic light emitting diode display device by passing through the second semitransparent electrode, the organic emissive layer, the first semitransparent electrode, the other selective reflection layer and the other polarization plate.

Another aspect is an organic light emitting diode display device wherein the other selective reflection layer includes a cholesteric liquid crystal.

BRIEF DESCRIPTION OF THE DRAWINGS

FIGS. 8(a) and 8(b) are tables listing the luminance values of organic light emitting diode displays according to the comparative example and the exemplary embodiment of FIG. 7.

FIGS. 13(a) and 13(b) are tables listing the luminance values of an organic light emitting diode and polarizing plates in organic light emitting diode displays according to the comparative example and the exemplary embodiment of FIG. 12.

DETAILED DESCRIPTION OF CERTAIN INVENTIVE EMBODIMENTS

Figure 1:
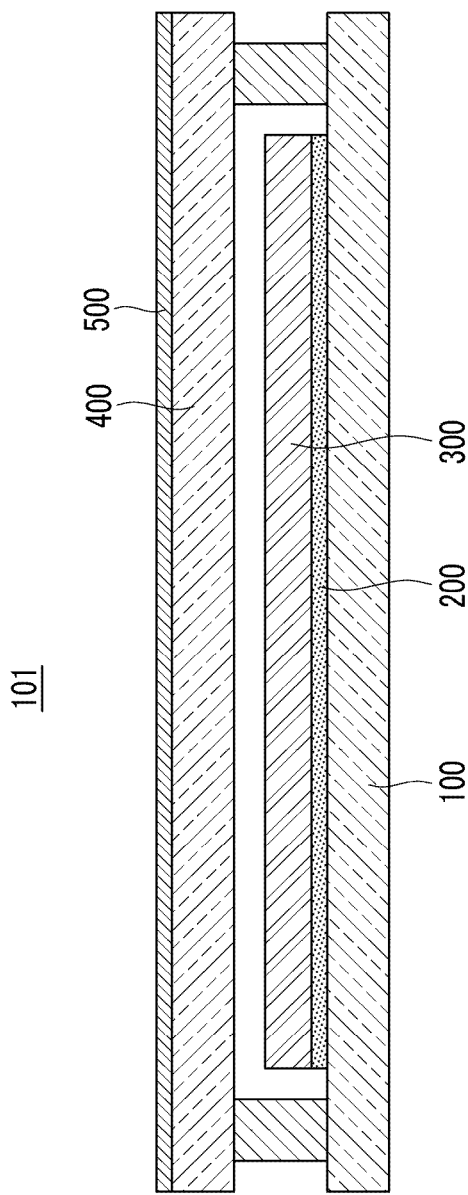
FIG. 1 is a cross-sectional view of an organic light emitting diode display according to an exemplary embodiment.

In the following detailed description, certain exemplary embodiments have been shown and described, simply by way of illustration. As those skilled in the art would realize, the described embodiments may be modified in various ways, without departing from the spirit or scope of the present invention.

Accordingly, the drawings and description are to be regarded as illustrative in nature and not restrictive. Like reference numerals generally designate like elements throughout the specification. In addition, when an element such as a layer, film, region, or substrate is referred to as being "on" another element, it can be directly on the other element or it can be indirectly on the another element with one or more intervening elements interposed therebetween. Also, when an element is said to include another constituent element, it may additionally include other constituent elements but may not exclude them unless a specific limitation to the contrary is made. When an element is referred to as being "on" another element, it may be placed over or below the other element but is not necessarily placed over the other element, based on the direction of gravity.

An organic light emitting diode display 101 according to an exemplary embodiment will now be described with reference to FIG. 1 thru FIG. 6.

FIG. 1 is a cross-sectional view of an organic light emitting diode display according to an exemplary embodiment.

As shown in FIG. 1, an organic light emitting diode display 101 according to an exemplary embodiment includes a first substrate 100, driving circuitry 200, an organic light emitting diode 300, a second substrate 400, and a first polarizing plate 500.

The first 100 and second 400 substrates are each formed of a transparent insulating material containing glass or a polymer. The first 100 and second 400 substrates face each other, and are sealed to each other by way of a sealant. The driving circuitry 200 and the organic light emitting diode 300 are disposed between the first 100 and second 400 substrates such that the first 100 and second 400 substrates protect the driving circuitry 200 and the organic light emitting diode 300 from external interference.

The driving circuitry 200 includes a switching thin film transistor 10 and a driving thin film transistor 20 (shown in FIG. 2), and transmits driving signals to the organic light emitting diode 300. The organic light emitting diode 300 emits light in accordance with the signals transmitted from the driving circuitry 200.

The organic light emitting diode 300 is placed on the driving circuitry 200.

The organic light emitting diode 300 is formed on the surface of the first substrate 100 by using a microelectromechanical systems (MEMS) technique such as photolithography. The organic light emitting diode 300 receives signals from the driving circuitry 200, and displays an image in accordance with the received signals.

The internal structure of the organic light emitting diode display 101 according to an exemplary embodiment will now be described in detail with reference to FIG. 2 thru FIG. 5.

Figure 2:
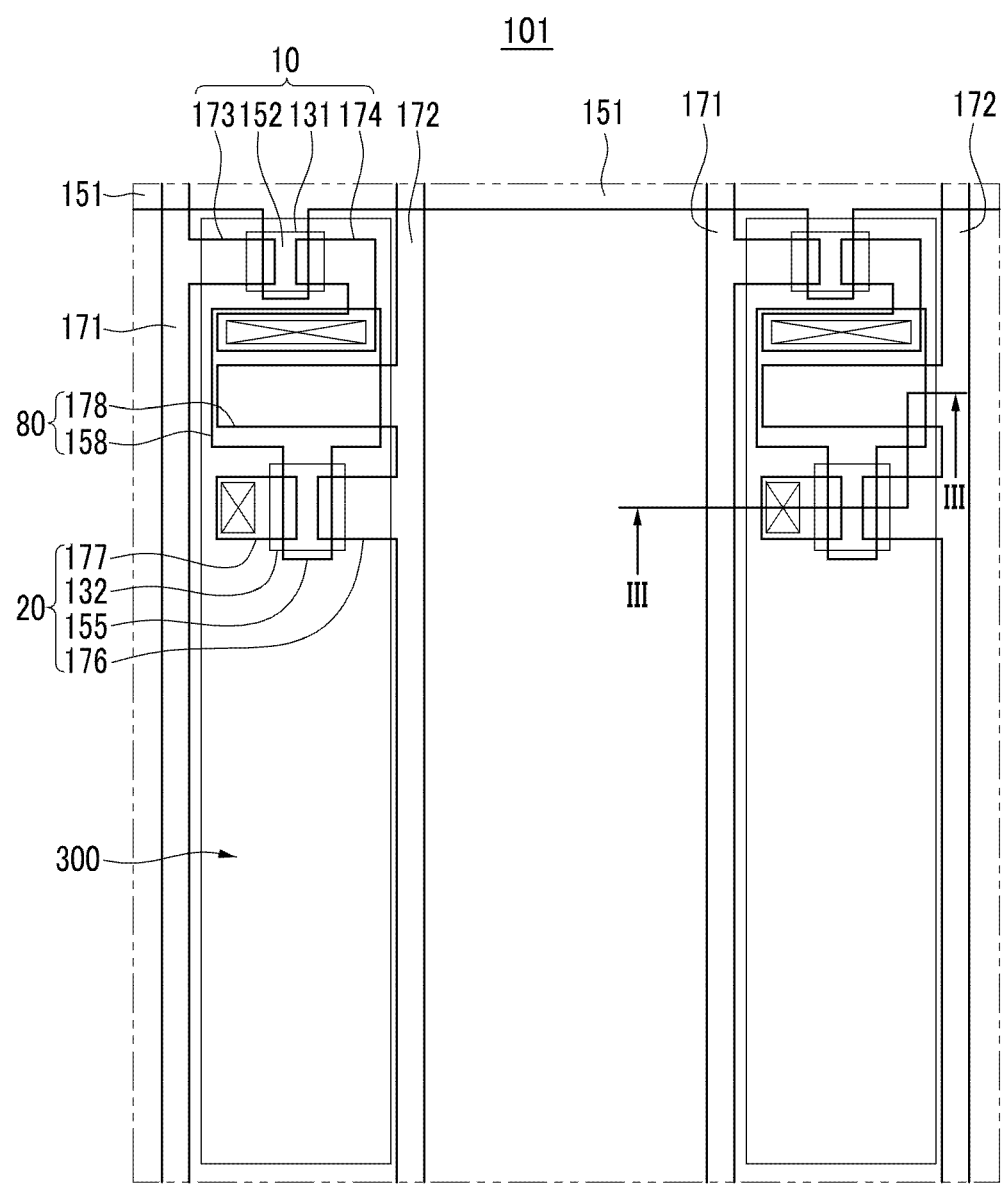
FIG. 2 is a layout view of a pixel structure of an organic light emitting diode display according to an exemplary embodiment.
Figure 3:
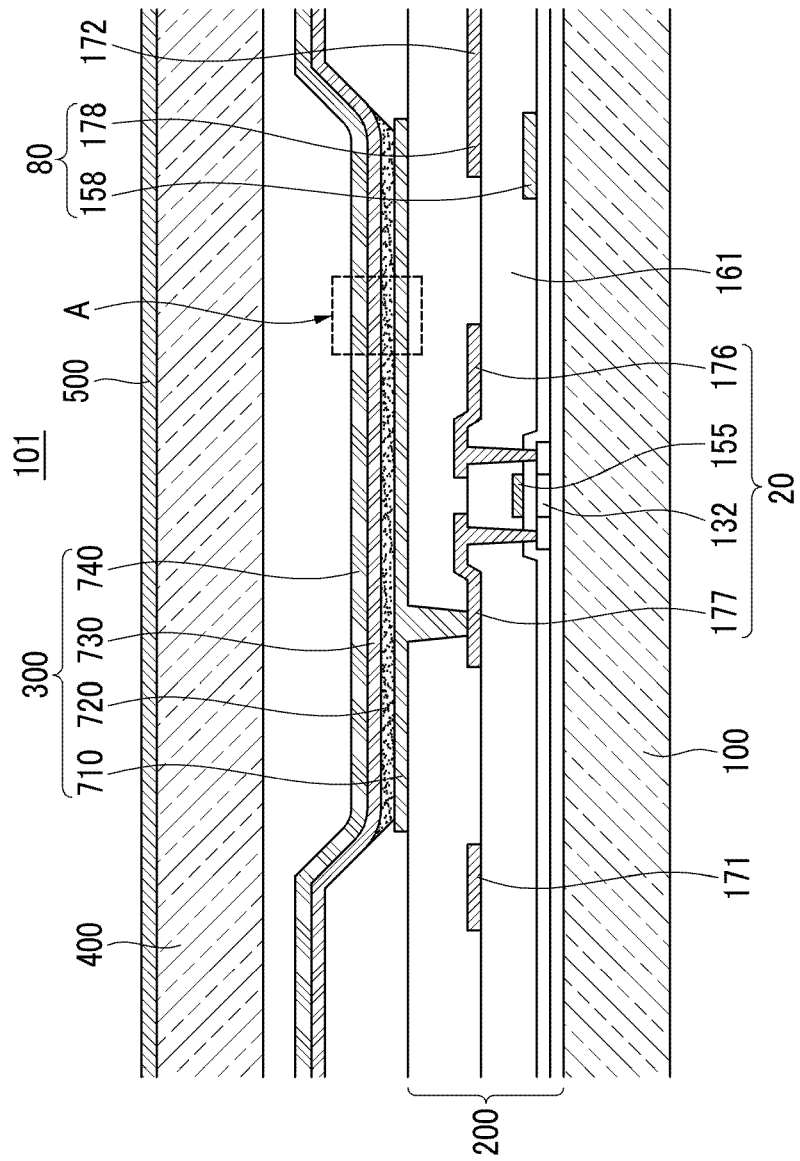
FIG. 3 is a cross-sectional view of an organic light emitting diode display taken along the III-III line of FIG. 2.

FIG. 2 is a layout view of a pixel structure of an organic light emitting diode display according to an exemplary embodiment. FIG. 3 is a cross-sectional view of an organic light emitting diode display taken along the III-III line of FIG. 2.

The structures of exemplary embodiments of the driving circuitry 200 and the organic light emitting diode 300 are illustrated in FIG. 2 and FIG. 3. The driving circuitry 200 and the organic light emitting diode 300 may be formed with various other structures known to a person skilled in the art. Embodiments of the organic light emitting diode display devices illustrated in the figures are active matrix (AM) type displays, with a structure where a pixel is provided with two thin film transistors (TFT) and one capacitor, but other structures with different numbers or types of transistors, capacitors and or driving circuitry may also be used. A pixel is an image displaying unit, and organic light emitting diode displays display images through a plurality of pixels.

As shown in FIG. 2, an exemplary embodiment of an organic light emitting diode display 101 includes a switching thin film transistor 10, a driving thin film transistor 20, a capacitor 80, and an organic light emitting diode 300 formed at each pixel. Driving circuitry 200 includes the switching thin film transistor 10, the driving thin film transistor 20, and the capacitor 80. The driving circuitry 200 further includes gate lines 151 arranged in a direction of the first substrate 100, data power line 171 and common power line 172 crossing the gate lines 151 in an insulated manner. A pixel is defined by taking the gate lines 151 and the data and common power lines 171 and 172 as a boundary, but is not limited thereto.

As shown in FIG. 3, the organic light emitting diode 300 includes a first semitransparent electrode 710, an organic emissive layer 720 placed on the first semitransparent electrode 710, a second semitransparent electrode 730 placed on the organic emissive layer 720, and a first selective reflection layer 740 placed on the second semitransparent electrode 730.

Figure 4:
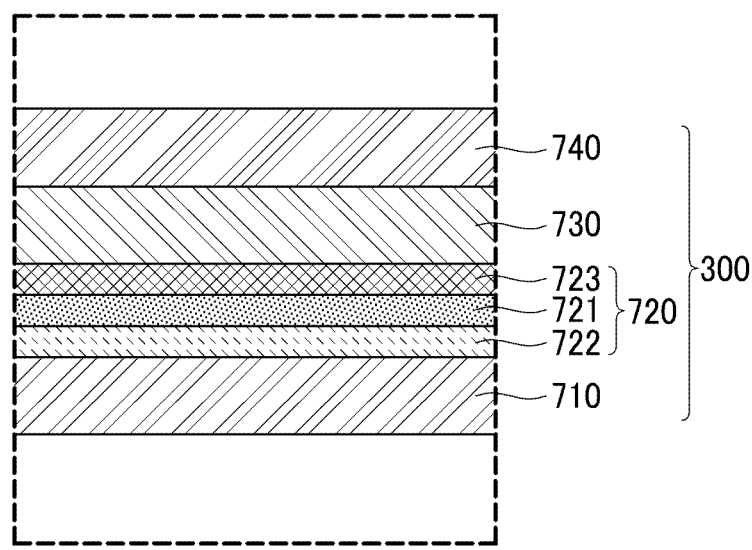
FIG. 4 is a magnified view of section A of FIG. 3.

FIG. 4 is a magnified view of section A of FIG. 3.

The first semitransparent electrode 710 shown in FIG. 4 functions as an anode being a hole injection electrode, and the second semitransparent electrode 730 functions as a cathode being an electron injection electrode. Other embodiments may have the first semitransparent electrode 710 functioning as the cathode and the second semitransparent electrode 730 functioning as the anode. Holes and electrons from the first 710 and second 730 semitransparent electrodes are injected into the organic emissive layer 720, and when the excitons formed by combinations of the injected holes and electrons drop from an excited state to a ground state, the organic emissive layer 720 emits light. The first 710 and second 730 semitransparent electrodes partially transmit light emitted from the organic emissive layer 720, and partially reflect it. One of or both the first 710 and second 730 semitransparent electrodes is or are formed with a single-layered or multiple-layered semitransparent conductive layer containing at least one material selected from lithium (Li), calcium (Ca), magnesium (Mg), silver (Ag), magnesium silver (MgAg), lithium aluminum (LiAl), indium tin oxide (ITO), and indium zinc oxide (IZO).

The organic emissive layer 720 includes a main emissive layer 721 emitting light, a hole organic layer 722 disposed between the main emissive layer 721 and the first semitransparent electrode 710, and an electron organic layer 723 disposed between the main emissive layer 721 and the second semitransparent electrode 730. The main emissive layer 721 is where the injected holes and electrons from the first 710 and second 730 semitransparent electrodes are combined. The hole organic layer 722 includes at least one of hole injection layers (HIL) and hole transport layers (HTL), and the electron organic layer 723 includes at least one of electron injection layers (EIL) and electron transport layers (ETL). The main emissive layer 721 includes a red emissive layer emitting red light, a green emissive layer emitting green light, and a blue emissive layer emitting blue light.

The organic light emitting diode display 101 illustrated in FIG. 1 thru 4 is a dual-side emission type display which emits light in the direction of both the first substrate 100 and the second substrate 400.

An exemplary embodiment of the first selective reflection layer 740 contains a cholesteric liquid crystal (CLC), and based on the intrinsic characteristics of the cholesteric liquid crystal, transmits one of left-circular and right-circular polarized lights emitted from the organic emissive layer 720, while reflecting the other of the left-circular and right-circular polarized lights.

Figure 5:
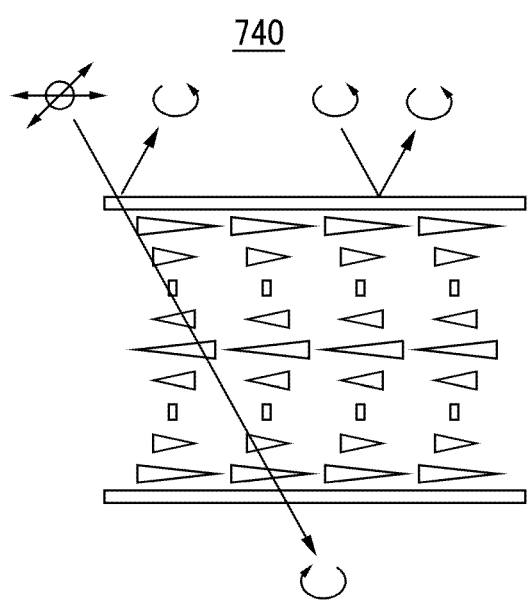
FIG. 5 illustrates some of the intrinsic characteristics of a cholesteric liquid crystal.

FIG. 5 illustrates some of the intrinsic characteristics of cholesteric liquid crystals.

As shown in FIG. 5, cholesteric liquid crystals have a layered structure like smectic liquid crystals, but the directors thereof are similar in molecular plane orientation to nematic liquid crystals. Specifically, cholesteric liquid crystals have a structure in which elongated molecules are arranged in order in a long axis direction in one plane and an arrangement orientation of a molecular axis is slightly deviated in a direction vertical to the plane, that is, a structure in which a molecular arrangement orientation circles a helical curve. That is, with the cholesteric liquid crystal, thin and long molecules proceed parallel to each other within a plane in the director axis direction, and the molecular axes are slightly deviated in orientation as they proceed vertical to the plane. Accordingly, the cholesteric liquid crystal wholly has a helical structure. Such a general structure is called a planar texture cholesteric liquid crystal, which selectively transmits any one of the left and right-circular polarized light illuminated thereto while reflecting the other. In one embodiment, the cholesteric liquid crystal contained in the first selective reflection layer 740 transmits the right-circular polarized light emitted by the organic emissive layer 720 while reflecting the left-circular polarized light emitted by the organic emissive layer. Left-circular polarized light reflected by the cholesteric liquid crystal of the first selective reflection layer 740 is substantially equivalent to the left-circular polarized light before the reflection. In other embodiments, the cholesteric liquid crystal contained in the first selective reflection layer 740 may transmit the left-circular polarized light emitted by the organic emissive layer 720 while reflecting the right-circular polarized light emitted by the organic emissive layer.

Based on the selective transmission or reflection of the first selective reflection layer 740, the light emitted from the organic emissive layer 720 is repeatedly transmitted or reflected among the first selective reflection layer 740 and the first and second semitransparent electrodes 710 and 730 so that the micro-cavity effect is increased, and the light emission efficiency of the organic light emitting diode display 101 is enhanced. The specific mechanism by which such a micro-cavity effect occurs will be described below.

Referring back to FIG. 2 and FIG. 3, the capacitor 80 has a pair of capacitor plates 158 and 178, separated by an interlayer insulating layer 161. The interlayer insulating layer 161 functions as a dielectric, and the capacitance of the capacitor 80 is determined by the charges across the capacitor 80 and the voltages across of the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switching element for selecting the pixel to be excited. The switching gate electrode 152 is connected to the gate line 151. The switching source electrode 173 is connected to the data line 171. The switching drain electrode 174 is spaced apart from the switching source electrode 173 by a distance, and is connected to one of the capacitor plates.

The driving thin film transistor 20 applies the driving power for exciting the organic emissive layer 720 of the organic light emitting diode 300 within the selected pixel to the first semitransparent electrode 710. The driving gate electrode 155 is connected to the capacitor plate 158, which is in turn connected with the switching drain electrode 174. The driving source electrode 176 and the other capacitor plate 178 are both connected to the common power line 172. The driving drain electrode 177 is connected to the first semitransparent electrode 710 of the organic light emitting diode 300 through a contact hole (not shown).

The switching thin film transistor 10 is operated by applying a gate voltage to the gate line 151 so as to transmit the data voltage applied to the data line 171 to the driving thin film transistor 20. The voltage corresponding to the difference between the common voltage applied from the common power line 172 to the driving thin film transistor 20 and the data voltage transmitted from the switching thin film transistor 10 is stored at the capacitor 80, and the current corresponding to the voltage stored at the capacitor 80 flows to the organic light emitting diode 300 through the driving thin film transistor 20 so as to drive the organic light emitting diode 300.

A first polarizing plate 500 is placed on the second substrate 400, which is in turn placed on the first selective reflection layer 740. The first polarizing plate 500 transmits the left-circular or right-circular polarized light transmitted through the first selective reflection layer 740. In an embodiment where the first selective reflection layer 740 transmits right-circular polarized light, the first polarizing plate 500 transmits the right-circular polarized light. Specifically, the first polarizing plate 500 transmits the light corresponding to the right-circular polarizing axis while absorbing the light not corresponding thereto, thereby transmitting the right-circular polarized light. The first polarizing plate 500 transmits the light transmitted through the first selective reflection layer 740 containing a cholesteric liquid crystal passing the right-circular polarized light, and only the right-circular polarized light is viewed from the side of the second substrate 400. The first polarizing plate 500 also only transmits right-circular polarized light to the organic light emitting diode 300 in the organic light emitting diode display 101 from the outside, and the organic light emitting diode display 101 is thus prevented from reflecting external light.

The improvement in luminance of an organic light emitting diode display 101 according to an exemplary embodiment will be described in detail with reference to FIG. 6.

Figure 6:
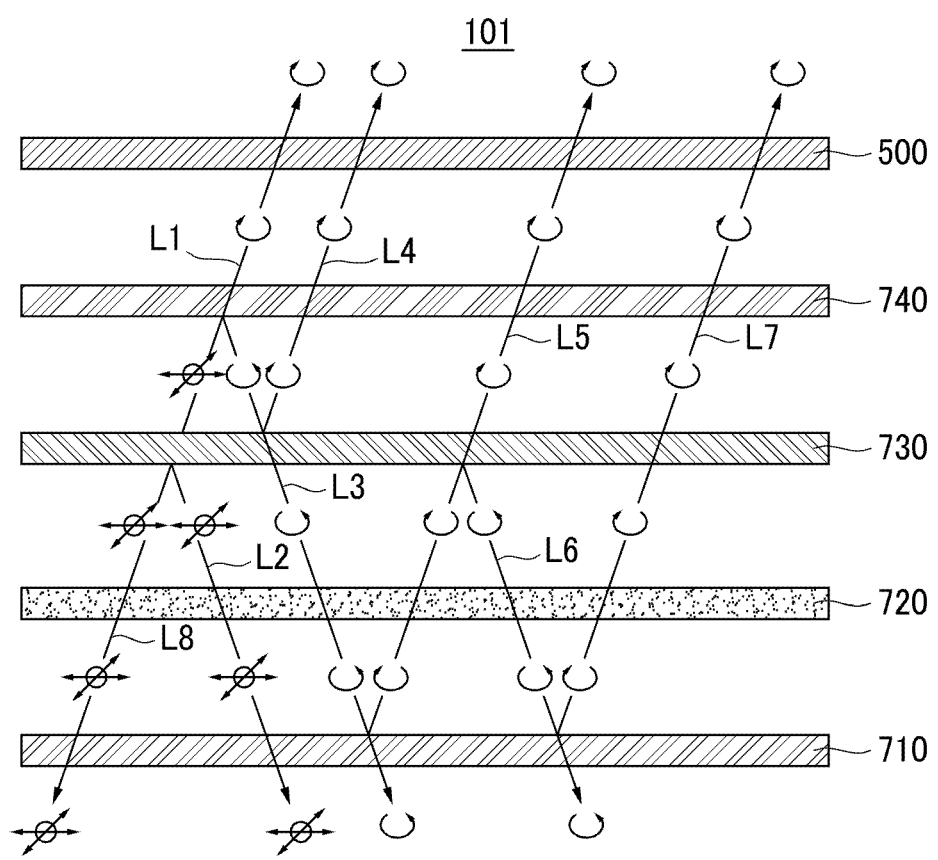
FIG. 6 illustrates the trajectory of light in an organic light emitting diode display according to an exemplary embodiment.

FIG. 6 illustrates the trajectory of light in an organic light emitting diode display according to an exemplary embodiment.

As shown in FIG. 6, a first light L1, initially emitted from the organic emissive layer 720, travels through to the second semitransparent electrode 730, is converted into right-circular polarized light when travelling through the first selective reflection layer 740, and is transmitted to the outside of the second substrate 400 after travelling through the first polarizing plate 500.

The first light L1 is also reflected by the second semitransparent electrode 730 so that it is shifted into a second light L2. The second light L2 is transmitted to the outside of the first substrate 100 after travelling through the organic emissive layer 720 and the first semitransparent electrode 710.

The first light L1 is also reflected by the first selective reflection layer 740 and is converted into left-circular polarized third light L3. The left-circular polarized third light L3 is transmitted to the outside of the first substrate 100 after travelling through the second semitransparent electrode 730, the organic emissive layer 720, and the first semitransparent electrode 710.

The left-circular polarized third light L3 is also reflected by the second semitransparent electrode 730 and is converted into right-circular polarized fourth light L4. The right-circular polarized fourth light L4 is transmitted to the outside of the second substrate 400 after travelling through the first selective reflection layer 740 and the first polarizing plate 500.

The left-circular polarized third light L3 is also reflected by the first semitransparent electrode 710 and is converted into right-circular polarized fifth light L5. The right-circular polarized fifth light L5 is transmitted to the outside of the second substrate 400 after travelling through the organic emissive layer 720, the second semitransparent electrode 730, the first selective reflection layer 740, and the first polarizing plate 500.

The right-circular polarized fifth light L5 is also reflected by the second semitransparent electrode 730 and is converted into left-circular polarized sixth light L6. The left-circular polarized sixth light L6 is transmitted to the outside of the first substrate 100 after travelling through the organic emissive layer 720 and the first semitransparent electrode 710.

The left-circular polarized sixth light L6 is also reflected by the first semitransparent electrode 710 and is converted into right-circular polarized seventh light L7. The right-circular polarized seventh light L7 is transmitted to the outside of the second substrate 400 after travelling through the organic emissive layer 720, the second semitransparent electrode 730, the first selective reflection layer 740, and the first polarizing plate 500.

As described above, the first light L1 is repeatedly reflected among the second semitransparent electrode 730, the first selective reflection layer 740, and the first semitransparent electrode 710 so that it is converted into the second to seventh lights L2 to L7. Consequently, the micro-cavity effect is increased in the organic light emitting diode display 101, and the light emission efficiency of the organic light emitting diode display 101 is enhanced.

An eighth light L8 initially emitted from the organic emissive layer 720, travels through to the first semitransparent electrode 710, and is not only transmitted to the outside of the second substrate 400 through the first semitransparent electrode 710, but is also converted in a manner similar to first light L1 which is converted into the second to seventh lights L2 to L7. Consequently, the micro-cavity effect is further increased in the organic light emitting diode display 101, and the light emission efficiency of the organic light emitting diode display 101 is further enhanced.

An exemplary embodiment will now be described with reference to FIG. 7 and FIG. 8 to demonstrate that the organic light emitting diode display 101 according to an exemplary embodiment has enhanced light emission efficiency. The thicknesses of the respective constituent elements are indicated by the accompanying numbers, and the unit of thickness is angstroms (Å).

Figure 7:
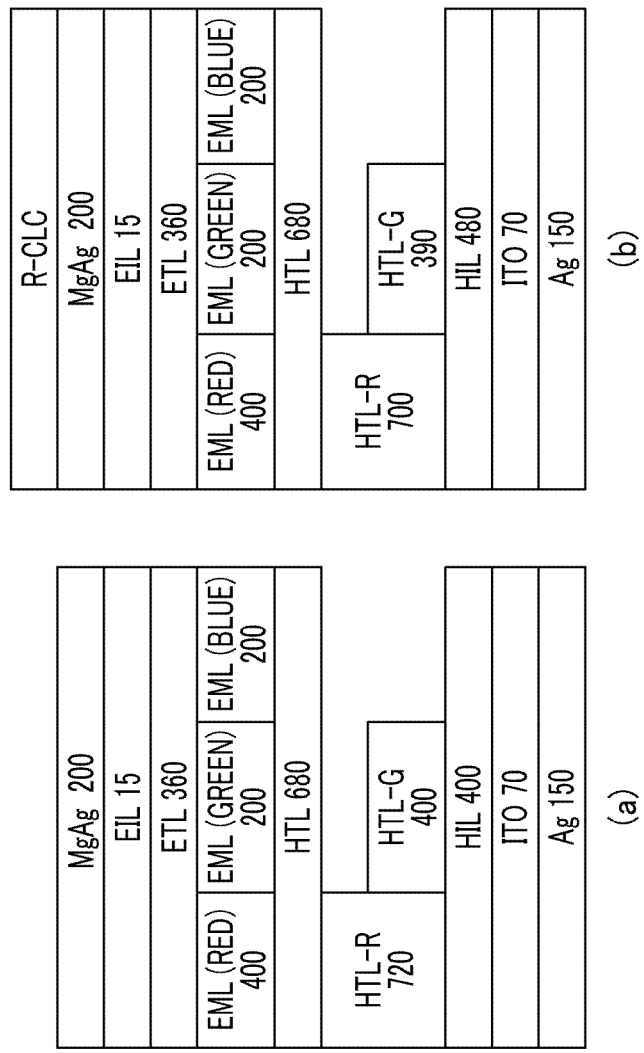
FIGS. 7(a) and 7(b) represent schematic sectional views of organic light emitting diode displays according to a comparative example and an exemplary embodiment, respectively.

FIGS. 7(a) and 7(b) represent schematic sectional views of organic light emitting diode displays according to a comparative example and an exemplary embodiment, respectively. FIGS. 8(a) and 8(b) are tables listing the luminance values of the organic light emitting diode displays of FIG. 7.

FIG. 7(a) represents a schematic sectional view of an organic light emitting diode display according to a comparative example 1. The organic light emitting diode display according to comparative example 1 includes a first semitransparent electrode, an organic emissive layer, and a second semitransparent electrode. The first semitransparent electrode includes a silver-based first semitransparent layer Ag 150, and an ITO-based second semitransparent layer ITO 70. The organic emissive layer includes a hole injection layer HIL 400, a red subsidiary hole transport layer HTL-R 720, a green subsidiary hole transport layer HTL-G 400, a hole transport layer HTL 680, a red emissive layer EML (RED) 400, a green emissive layer EML (GREEN) 200, a blue emissive layer EML (BLUE) 200, an electron transport layer ETL 360, and an electron injection layer EIL 15. The second semitransparent electrode is formed with a magnesium silver-based electrode MgAg 200.

The luminance values measured in the organic light emitting diode display according to comparative example 1 are listed in the table of FIG. 8(a).

FIG. 7(b) represents a schematic sectional view of an organic light emitting diode display according to an exemplary embodiment. The organic light emitting diode display according to an exemplary embodiment includes a first semitransparent electrode, an organic emissive layer, a second semitransparent electrode, and, additionally, a first selective reflection layer. The first semitransparent electrode includes a silver-based first semitransparent layer Ag 150, and an ITO-based second semitransparent layer ITO 70. The organic emissive layer includes a hole injection layer HIL 480, a red subsidiary hole transport layer HTL-R 700, a green subsidiary hole transport layer HTL-G 390, a hole transport layer HTL 680, a red emissive layer EML (RED) 400, a green emissive layer EML (GREEN) 200, a blue emissive layer EML (BLUE) 200, an electron transport layer ETL 360, and an electron injection layer EIL 15. The second semitransparent electrode is formed with a magnesium silver-based electrode MgAg 200. The first selective reflection layer is formed with a cholesteric liquid crystal-based layer, R-CLC, transmitting right-circular polarized light.

The luminance values measured in the organic light emitting diode display according to the exemplary embodiment of FIG. 7(b) are listed in the table of FIG. 8(b). These values were compared with the luminance values of the organic light emitting diode display of the comparative example of FIG. 7(a), shown in FIG. 8(a). The organic light emitting diode display with the first selective reflection layer according to an exemplary embodiment enhanced the light emission efficiency of red light by about 11.3% when compared to the light emission efficiency of the red light emitted by the organic light emitting diode display according to the comparative example 1, which has no selective reflection layer.

An organic light emitting diode display 102 according to another exemplary embodiment will now be described with reference to FIG. 9 and FIG. 10.

Figure 9:
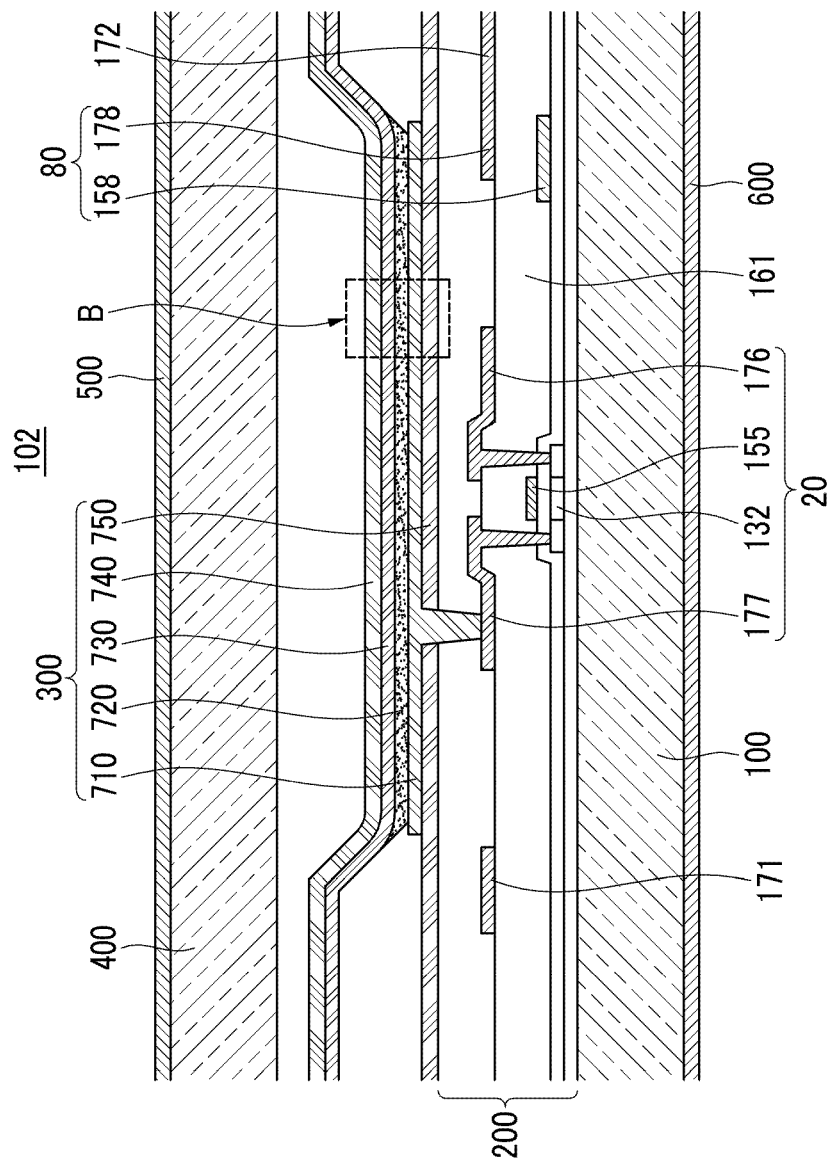
FIG. 9 is a cross-sectional view of an organic light emitting diode display according to an exemplary embodiment.

FIG. 9 is a cross-sectional view of an organic light emitting diode display according to an exemplary embodiment.

As shown in FIG. 9, an organic light emitting diode display 102 according to an exemplary embodiment includes a first substrate 100, driving circuitry 200, an organic light emitting diode 300, a second substrate 400, a first polarizing plate 500, and a second polarizing plate 600.

The organic light emitting diode 300 includes a first semitransparent electrode 710, an organic emissive layer 720 placed on the first semitransparent electrode 710, a second semitransparent electrode 730 placed on the organic emissive layer 720, a first selective reflection layer 740 placed on the second semitransparent electrode 730, and a second selective reflection layer 750 placed under the first semitransparent electrode 710.

Figure 10:
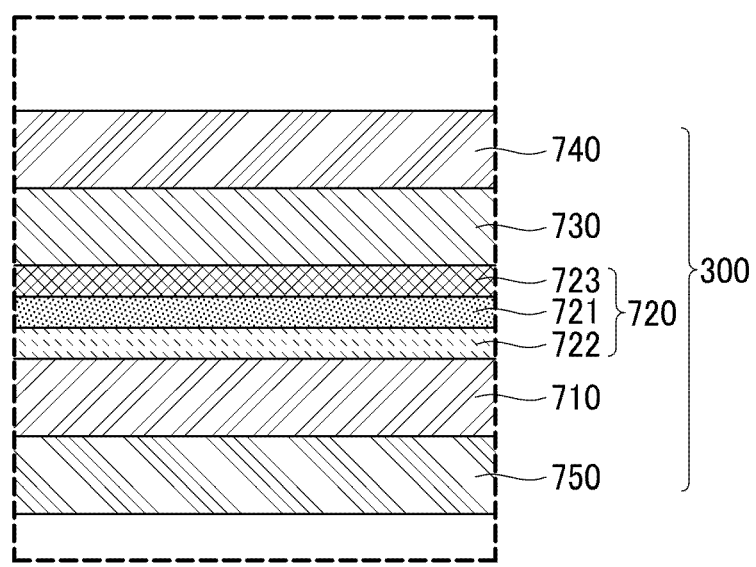
FIG. 10 is a magnified view of section B of FIG. 9.

FIG. 10 is a magnified view of section B of FIG. 9. The second selective reflection layer 750 shown in FIG. 10 contains a cholesteric liquid crystal, and based on the intrinsic characteristics of the cholesteric liquid crystal, transmits one of the left-circular and right-circular polarized lights emitted from the organic emissive layer 720, and reflect the other one of the left-circular and right-circular polarized lights. The cholesteric liquid crystal contained in the second selective reflection layer 750 according to an exemplary embodiment may transmit the right-circular polarized light while reflecting the left-circular polarized. In an organic light emitting diode display 102 according to such an exemplary embodiment, the first and second selective reflection layers 740 and 750 both transmit the right-circular polarized light while reflecting the left-circular polarized light.

In other embodiments, there may be other variations of the polarizations of the lights transmitted and reflected by the selective reflection layers 740 and 750.

Based on the selective transmission or reflection of the first and second selective reflection layers 740 and 750, the light emitted from the organic emissive layer 720 is repeatedly reflected or transmitted among the second selective reflection layer 750, the first semitransparent electrode 710, the second semitransparent electrode 730, and the first selective reflection layer 740 such that the micro-cavity effect is increased, and the light emission efficiency of the organic light emitting diode display 102 is enhanced. The specific mechanism by which the micro-cavity effect occurs will be described below.

A second polarizing plate 600 is placed under the first substrate 100. The second polarizing plate 600 transmits the left-circular or right-circular polarized light transmitted through the second selective reflection layer 750. Specifically, the second polarizing plate 600 transmits the light corresponding to the axis of polarization of the light transmitted through the second selective reflection layer 750 and absorbs the light not corresponding to the axis of polarization of the light transmitted through the second selective reflection layer 750. In one embodiment, the second polarizing plate 600 transmits the right-circular polarized light transmitted through the cholesteric liquid crystal of the second selective reflection layer 750 so that only the right-circular polarized light is viewed on the outside of the first substrate 100. The second polarizing plate 600 also transmits only the right-circular polarized light to the organic light emitting diode 300 from the outside, and the organic light emitting diode display 102 is thus prevented from reflecting external light.

The improvement in light emission efficiency of an organic light emitting diode display according to an exemplary embodiment is will be described in detail with reference to FIG. 11.

Figure 11:
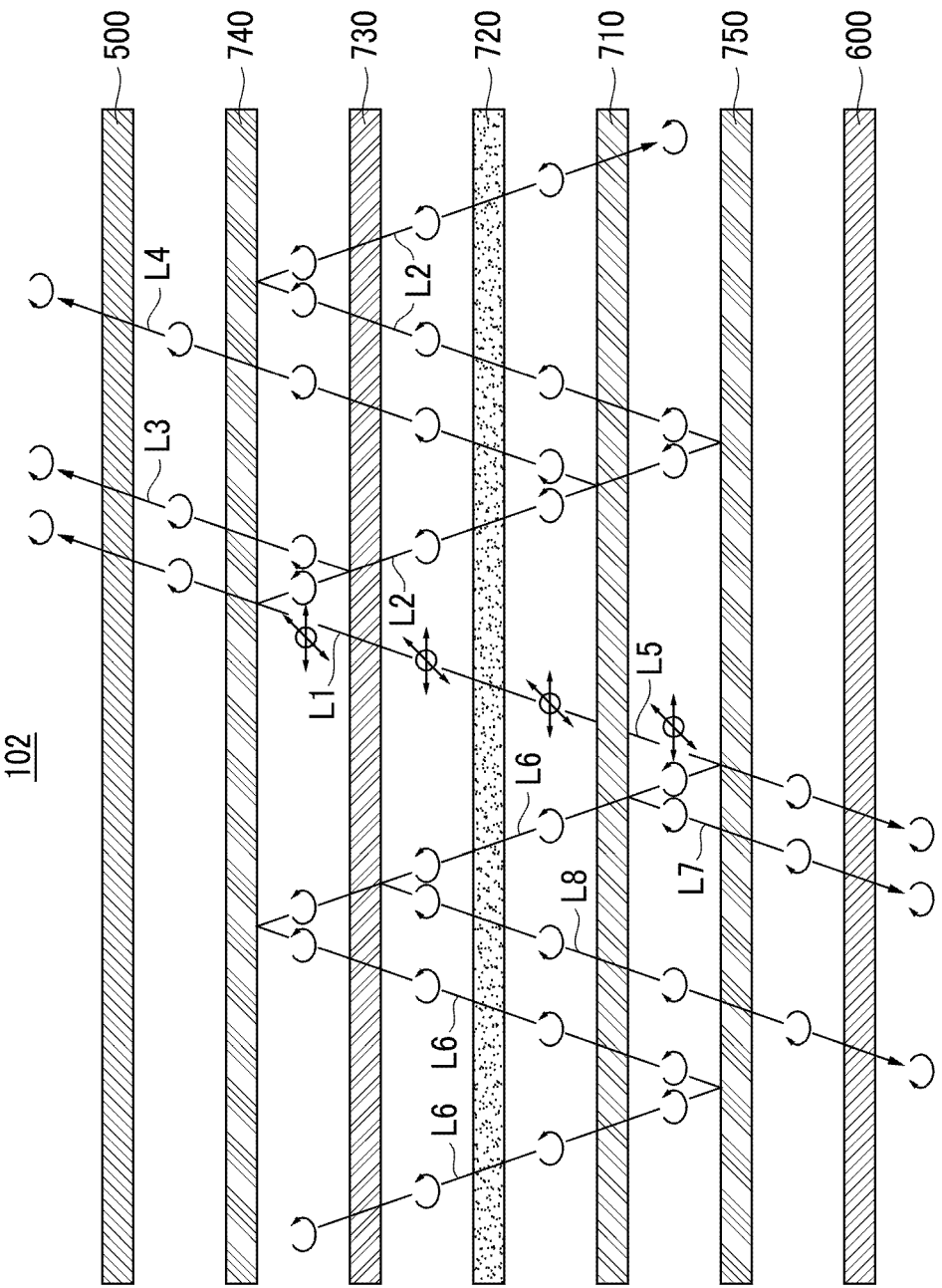
FIG. 11 illustrates the trajectory of light in an organic light emitting diode display according to an exemplary embodiment.

FIG. 11 illustrates the trajectory of light in an organic light emitting diode display according to an exemplary embodiment.

As shown in FIG. 11, a first light L1, initially emitted from the organic emissive layer 720, travels through to the second semitransparent electrode 730, is converted into right-circular polarized light when travelling through the first selective reflection layer 740, and is transmitted to the outside of the second substrate 400 after travelling through the first polarizing plate 500.

The first light L1 may be reflected by the second semitransparent electrode 730 while the first semitransparent electrode 710 is transmitting or reflecting the reflected first light L1, but for better understanding and ease of description, the reflection of the first light L1 by way of the second semitransparent electrode 730 will not be described.

The first light L1 is also reflected by the first selective reflection layer 740 and is converted into left-circular polarized second light L2. The left-circular polarized second light L2 is transmitted to the second selective reflection layer 750 after travelling through the second semitransparent electrode 730, the organic emissive layer 720, and the first semitransparent electrode 710. The left-circular polarized second light L2 is reflected by the second selective reflection layer 750 and again transmitted to the first selective reflection layer 740 while being left-circular polarized. The left-circular polarized second light L2 is again reflected by the first selective reflection layer 740. The second light L2 is repeatedly reflected between the first selective reflection layer 740 and the second selective reflection layer 750 while being left-circular polarized.

The left-circular polarized second light L2 is also reflected by the second semitransparent electrode 730 and is converted into right-circular polarized third light L3. The right-circular polarized third light L3 is transmitted to the outside of the second substrate 400 after travelling through the first selective reflection layer 740 and the first polarizing plate 500.

The left-circular polarized second light L2 is also reflected by the first semitransparent electrode 710 and is converted into right-circular polarized fourth light L4. The right-circular polarized fourth light L4 is transmitted to the outside of the second substrate 400 after travelling through the organic emissive layer 720, the second semitransparent electrode 730, the first selective reflection layer 740, and the first polarizing plate 500. The right-circular polarized fourth light L4 is also reflected by the second semitransparent electrode 730 and is converted into left-circular polarized light. This left-circular polarized light is repeatedly reflected between the first selective reflection layer 740 and the second selective reflection layer 750 while being left-circular polarized.

The fifth light L5 initially emitted from the organic emissive layer 720 travels through the first semitransparent electrode 710 and the second selective reflection layer 750, is converted into right-circular polarized light, which is transmitted to the outside of the first substrate 100 after travelling through the second polarizing plate 600.

The fifth light L5 may be reflected by the first semitransparent electrode 710 while the second semitransparent electrode 730 is transmitting or reflecting the reflected fifth light L5, but for better understanding and ease of description, the reflection of the fifth light L5 by way of the first semitransparent electrode 710 will not be described.

The fifth light L5 is also reflected by the second selective reflection layer 750 and is converted into left-circular polarized sixth light L6. The left-circular polarized sixth light L6 is transmitted to the first selective reflection layer 740 after travelling through the first semitransparent electrode 710, the organic emissive layer 720, and the second semitransparent electrode 730. The left-circular polarized sixth light L6 is reflected by the first selective reflection layer 740 and again transmitted to the second selective reflection layer 750 while being left-circular polarized. The left-circular polarized sixth light L6 is again reflected by the second selective reflection layer 750. The left-circular polarized sixth light L6 is repeatedly reflected between the second selective reflection layer 750 and the first selective reflection layer 740 while being left-circular polarized.

The left-circular polarized sixth light L6 is also reflected by the first semitransparent electrode 710 and is converted into right-circular polarized seventh light L7. The right-circular polarized seventh light L7 is transmitted to the outside of the first substrate 100 after travelling through the second selective reflection layer 750 and the second polarizing plate 600.

The left-circular polarized sixth light L6 is also reflected by the first semitransparent electrode 710 and is converted into right-circular polarized eighth light L8. The right-circular polarized eighth light L8 is transmitted to the outside of the first substrate 100 after travelling through the organic emissive layer 720, the first semitransparent electrode 710, the second selective reflection layer 750, and the second polarizing plate 600. The right-circular polarized eighth light L8 is also reflected by the first semitransparent electrode 710 and is converted into left-circular polarized light. This left-circular polarized light is repeatedly reflected between the second selective reflection layer 750 and the first selective reflection layer 740 while being left-circular polarized.

As described above, the first light L1 initially emitted from the organic emissive layer 720 is repeatedly reflected among the second semitransparent electrode 730, the first selective reflection layer 740, the first semitransparent electrode 710, and the second selective reflection layer 750 and is converted into the second to fourth lights L2 to L4 transmitted to the outside. The fifth light L5 initially emitted from the organic emissive layer 720 is repeatedly reflected among the first semitransparent electrode 710, the second selective reflection layer 750, the second semitransparent electrode 730, and the first selective reflection layer 740 and is converted into the sixth to eighth lights L6 to L8 transmitted to the outside.

Consequently, the micro-cavity effect is increased in the organic light emitting diode display 102, and the light emission efficiency of the organic light emitting diode display 102 is enhanced.

An exemplary embodiment will now be described with reference to FIG. 12 and FIG. 13 to demonstrate that the organic light emitting diode display 102 according to an exemplary embodiment has enhanced light emission efficiency. The thicknesses of the respective constituent elements are indicated by the accompanying numbers, and the unit of thickness is angstroms (Å).

Figure 12:
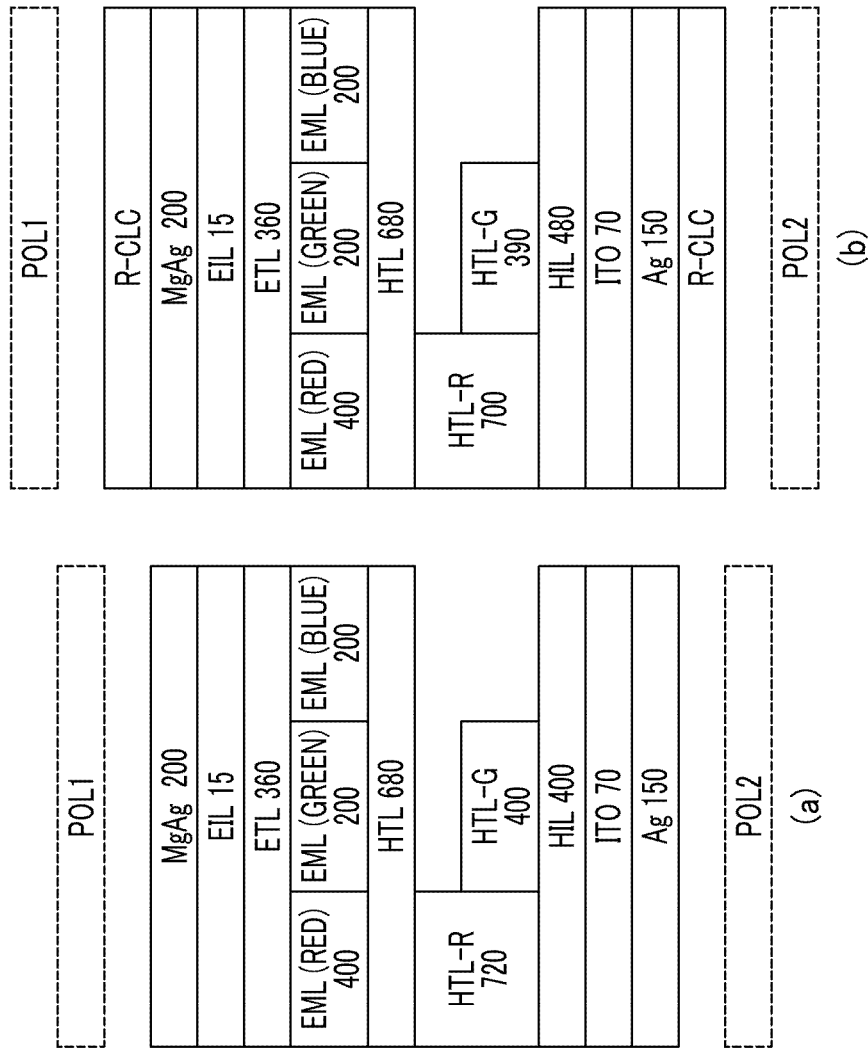
FIGS. 12(a) and 12(b) represent schematic sectional views of an organic light emitting diode and polarizing plates in organic light emitting diode displays according to a comparative example and an exemplary embodiment, respectively.

FIGS. 12(a) and 12(b) represent schematic sectional views of an organic light emitting diode and polarizing plates in organic light emitting diode displays according to a comparative example and an exemplary embodiment, respectively. FIGS. 13(a) and 13(b) are tables listing the luminance values of an organic light emitting diode and polarizing plates in organic light emitting diode displays according to the comparative example and the exemplary embodiment of FIG. 12.

FIG. 12(a) represents a schematic sectional view of an organic light emitting diode and polarizing plates in an organic light emitting diode display according to comparative example 2. The organic light emitting diode in comparative example 2 includes a first semitransparent electrode, an organic emissive layer, and a second semitransparent electrode. Comparative example 2 includes a first polarizing plate POL1 and a second polarizing plate POL2. The first semitransparent electrode includes a silver-based first semitransparent layer Ag 150, and an ITO-based second semitransparent layer ITO 70. The organic emissive layer includes a hole injection layer HIL 400, a red subsidiary hole transport layer HTL-R 720, a green subsidiary hole transport layer HTL-G 400, a hole transport layer HTL 680, a red emissive layer EML (RED) 400, a green emissive layer EML (GREEN) 200, a blue emissive layer EML (BLUE) 200, an electron transport layer ETL 360, and an electron injection layer EIL 15. The second semitransparent electrode is formed with a magnesium silver-based electrode MgAg 200.

The luminance values measured in the organic light emitting diode and the polarizing plates of the organic light emitting diode display according to comparative example 2 are listed in the table of FIG. 13(a).

FIG. 12(b) represents a schematic sectional view of an organic light emitting diode and polarizing plates in an organic light emitting diode display according to an exemplary embodiment. The organic light emitting diode according to an exemplary embodiment includes a second selective reflection layer, a first semitransparent electrode, an organic emissive layer, a second semitransparent electrode, and a first selective reflection layer. The exemplary embodiment includes a first polarizing plate POL1 and a second polarizing plate POL2. The second selective reflection layer is formed with a cholesteric liquid crystal-based layer R-CLC transmitting the right-circular polarized light. The first semitransparent electrode includes a silver-based first semitransparent layer Ag 150, and an ITO-based second semitransparent layer ITO 70. The organic emissive layer includes a hole injection layer HIL 480, a red subsidiary hole transport layer HTL-R 700, a green subsidiary hole transport layer HTL-G 390, a hole transport layer HTL 680, a red emissive layer EML (RED) 400, a green emissive layer EML (GREEN) 200, a blue emissive layer EML (BLUE) 200, an electron transport layer ETL 360, and an electron injection layer EIL 15. The second semitransparent electrode is formed with a magnesium silver-based electrode MgAg 200. The first selective reflection layer is formed with a cholesteric liquid crystal-based layer R-CLC transmitting the right-circular polarized light.

The luminance values measured at the organic light emitting diode and the polarizing plates of the organic light emitting diode display according to the exemplary embodiment of FIG. 12(b) are listed in the table of FIG. 13(b). These values were compared with the luminance values of the organic light emitting diode display of the comparative example of FIG. 12(a), shown in FIG. 13(a). The organic light emitting diode display with the first and second selective reflection layers according to the exemplary embodiment enhanced the light emission efficiency of blue light by about 99% and the light efficiency of red light by about 115% when compared to the light emission efficiency of the organic light emitting diode display according to comparative example 2, which has no selective reflection layers.

An organic light emitting diode display 103 according to another exemplary embodiment will now be described with reference to FIG. 14.

Figure 14:
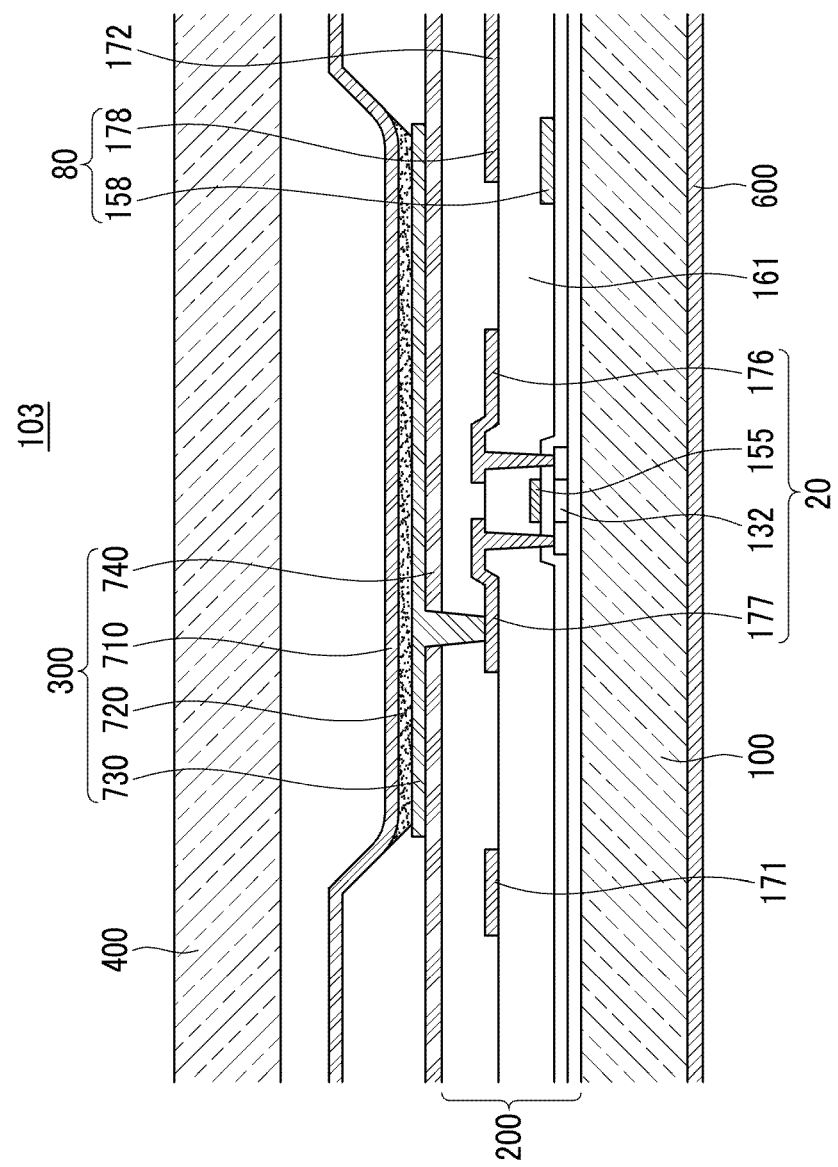
FIG. 14 is a cross-sectional view of an organic light emitting diode display according to an exemplary embodiment.

FIG. 14 is a cross-sectional view of an organic light emitting diode display according to an exemplary embodiment.

The organic light emitting diode 300 includes a first semitransparent electrode 710, an organic emissive layer 720 placed on the first semitransparent electrode 710, a second semitransparent electrode 730 placed on the organic emissive layer 720, and a first selective reflection layer 740 placed on the second semitransparent electrode 730.

The first selective reflection layer 740 contains a cholesteric liquid crystal, and based on the intrinsic characteristics of the cholesteric liquid crystal, the first selective reflection layer 740 transmits one of the left-circular and right-circular polarized lights emitted from the organic emissive layer 720, and reflects the other of the polarized lights. In one embodiment, the cholesteric liquid crystal contained in the first selective reflection layer 740 transmits the right-circular polarized light while reflecting the left-circular polarized light.

A second polarizing plate 600 is placed on the first substrate 100 over the first selective reflection layer 740 so as to transmit the left-circular or right-circular polarized light transmitted through the first selective reflection layer 740. The second polarizing plate 600 transmits the light of the same polarization as the light transmitted by the selective reflection layer 740.

The organic light emitting diode display 103 according to an exemplary embodiment has a first selective reflection layer 740 so as to enhance the light emission efficiency.

In some embodiments, the first and second selective reflection layers may each be adjacent to the first and second electrodes, respectively. In other embodiments, the first and second selective reflection layers may each be spaced apart from the first and second electrodes by a distance, respectively.

While this disclosure has been described in connection with certain exemplary embodiments, it is to be understood that the invention is not limited to the disclosed embodiments, but, on the contrary, is intended to cover various modifications and equivalent arrangements.

What is claimed is:
1. An organic light emitting diode display device comprising:
    a first semitransparent electrode;
    an organic emissive layer placed on the first semitransparent electrode and configured to emit light comprising a left-circular polarized light beam and a right-circular polarized light beam;

a second semitransparent electrode placed on the organic emissive layer; and a first selective reflection layer placed on the second semitransparent electrode.

2. The organic light emitting diode display device of claim 1, wherein the first selective reflection layer comprises a cholesteric liquid crystal.

3. The organic light emitting diode display device of claim 2, wherein the first selective reflection layer is configured to either transmit the left-circular polarized light beam and reflect the right-circular polarized light beam or transmit the right-circular polarized light beam and reflect the left-circular polarized light beam.

4. The organic light emitting diode display device of claim 3, wherein the light beam reflected from the first selective reflection layer is configured to be transmitted to the outside of the organic light emitting diode display device by passing through the second semitransparent electrode, the organic emissive layer and the first semitransparent electrode, thereby reinforcing the light emitted from the organic emissive layer, transmitted to the outside after travelling the first semitransparent electrode, and the light emitted from the organic emissive layer, transmitted to the outside after being reflected by the second semitransparent electrode, and then travelling through the first semitransparent electrode.

5. The organic light emitting diode display device of claim 3, further comprising a first polarizing plate placed on the first selective reflection layer configured to transmit to the outside of the device the polarized light beam transmitted through the first selective reflection layer, to absorb the light beam of opposite polarization, and to transmit to the first selective reflection layer only external light of the same polarization, wherein the first selective reflection layer transmits the external light of the same polarization, thereby minimizing reflection of external light.

6. The organic light emitting diode display device of claim 1, wherein one of the first and second semitransparent electrodes functions as an anode, and the other functions as a cathode.

7. An organic light emitting diode display device comprising:

a first semitransparent electrode;

an organic emissive layer placed over the first semitransparent electrode and configured to emit light comprising light beams of a first polarization and light beams of a second polarization, wherein the second polarization is an opposite polarization of the first polarization;

a second semitransparent electrode placed over the organic emissive layer;

a selective reflection layer placed over the second semitransparent electrode and configured to substantially transmit the light beams of the first polarization and to substantially reflect the light beams of the second polarization; and a polarizing plate placed over the selective reflection layer and configured to substantially transmit to the outside the light beams of the first polarization transmitted through the selective reflection layer, and further to substantially transmit light beams of the first polarization from the outside of the device.

8. The device of claim 7, wherein the selective reflection layer is further configured to transmit toward the organic emissive layer the light beams of the first polarization from the outside of the device without substantial reflection of the light beams of the first polarization.

9. The device of claim 7, wherein the selective reflection layer comprises a cholesteric liquid crystal.

10. The device of claim 7, wherein the selective reflection layer is configured to mostly transmit the light beams of the first polarization and mostly reflect the light beam of the second polarization.

11. The device of claim 10, wherein the polarizing plate is further configured to absorb light beams of the second polarization from the outside of the device.

12. The device of claim 7, wherein the selective reflection layer is configured to transmit a right-circular polarized light beam from the organic emissive layer toward the polarizing plate and to reflect a left-circular polarized light beam from the organic emissive layer.

13. The device of claim 7, wherein the device is further configured to permit a light beam of the second polarization reflected from the selective reflection layer to be transmitted to the outside of the organic light emitting diode display device by passing through the second semitransparent electrode, the organic emissive layer and the first semitransparent electrode.

14. The device of claim 7, wherein the polarizing plate is further configured to absorb light beams of the second polarization from the outside of the device, thereby minimizing reflection of light beams from the outside in the device.

* * * * *